(12) United States Patent
Matthews, Jr. et al.

(10) Patent No.: US 8,013,762 B2
(45) Date of Patent: Sep. 6, 2011

(54) EVALUATING ALTERNATIVE ENCODING SOLUTIONS DURING DATA COMPRESSION

(75) Inventors: Donald Preston Matthews, Jr., Longmont, CO (US); David Orrin Sluiter, Superior, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 39 days.

(21) Appl. No.: 12/611,572

(22) Filed: Nov. 3, 2009

(65) Prior Publication Data

US 2011/0102207 A1    May 5, 2011

(51) Int. Cl.
*H03M 7/34* (2006.01)
*H03M 7/38* (2006.01)

(52) U.S. Cl. .......................................... 341/51; 341/87
(58) Field of Classification Search .................... 341/51, 341/87
See application file for complete search history.

(56) References Cited

U.S. PATENT DOCUMENTS

| | | | |
|---|---|---|---|
| 5,339,076 A | | 8/1994 | Jiang |
| 5,450,562 A | | 9/1995 | Rosenberg et al. |
| 5,469,161 A | | 11/1995 | Bezek |
| 5,612,878 A | | 3/1997 | Joao et al. |
| 5,635,932 A | * | 6/1997 | Shinagawa et al. .......... 341/51 |
| 5,652,878 A | | 7/1997 | Craft |
| 5,694,125 A | | 12/1997 | Owsley et al. |
| 5,729,228 A | | 3/1998 | Franaszek et al. |
| 5,771,011 A | | 6/1998 | Masenas |
| 5,875,454 A | | 2/1999 | Craft et al. |
| 5,903,230 A | * | 5/1999 | Masenas .......................... 341/51 |
| 6,037,883 A | * | 3/2000 | Forbes ............................ 341/51 |
| 6,320,522 B1 | * | 11/2001 | Satoh ............................... 341/51 |
| 6,392,567 B2 | * | 5/2002 | Satoh ............................... 341/51 |
| 6,411,227 B1 | * | 6/2002 | Fish ................................. 341/51 |
| 6,597,812 B1 | | 7/2003 | Fallon et al. |
| 6,657,565 B2 | | 12/2003 | Kampf |
| 6,693,567 B2 | | 2/2004 | Cockburn et al. |
| 7,064,489 B2 | | 6/2006 | Price |
| 7,180,433 B1 | | 2/2007 | Grotmol |
| 7,215,259 B2 | * | 5/2007 | Kerber et al. .................. 341/51 |
| 7,233,265 B2 | | 6/2007 | Cockburn et al. |
| 7,623,047 B2 | * | 11/2009 | Ordentlich et al. ............ 341/51 |
| 2004/0083335 A1 | | 4/2004 | Gonzalez et al. |
| 2008/0091872 A1 | | 4/2008 | Bennett et al. |

OTHER PUBLICATIONS

Toyota Fujioka and Hirotomo Aso, "Parallel Architecture for High-Speed Lempel-Ziv Data Coding/Decoding," Systems and Computers in Japan, 1998, pp. 28-37, vol. 29, No. 8, Wiley, US.
R. Nigel Horspool, "The effect of Non-Greedy Parsing in Ziv-Lempel Compression Methods," Proceedings of the Conference on Data Compression, Jan. 1, 1995, pp. 1-10, IEE, US.
C.-Y. Lee and R.-Y. Yang, "High-throughput data compressor designs using content addressable memory," IEE Proceedings: Circuits Devices and Systems, Feb. 1, 1995, pp. 69-73, vol. 142, No. 1, Stenvenage, GB.

\* cited by examiner

*Primary Examiner* — Khai M Nguyen
(74) *Attorney, Agent, or Firm* — Fellers, Snider, et al.

(57) ABSTRACT

Method and apparatus for compressing data. In accordance with various embodiments, an input string of data bits is received and arranged into fixed-sized chunks. Multiple successive chunks of the input string are compared to previously received chunks of the input string during a single clock cycle. At least two alternative encoding solutions are identified based on matches obtained during said comparison. The input string is compressed to form a compressed output string using a selected one of the at least two alternative encoding solutions that achieves a fewer number of bits in said output string.

20 Claims, 14 Drawing Sheets

INPUT DATA
ABCDXAYABCDZ...

| ADDR | CAM | MATCH0 | LENGTH | OUTPUT |
|------|-----|--------|--------|--------|
| 0 | A | NONE | 0 | LITERAL(A) |
| 1 | B | NONE | 0 | LITERAL(B) |
| 2 | C | NONE | 0 | LITERAL(C) |
| 3 | D | NONE | 0 | LITERAL(D) |
| 4 | X | NONE | 0 | LITERAL(X) |
| 5 | A | CAM MATCH (0) | 1 | NONE |
| 6 | Y | NONE | 0 | LITERAL(A),LITERAL(Y) |
| 7 | A | CAM MATCH (0),(5) | 1 | NONE |
| 8 | B | SHIFTMATCH (1) | 2 | NONE |
| 9 | C | SHIFTMATCH (2) | 3 | NONE |
| 10 | D | SHIFTMATCH (3) | 4 | NONE |
| 11 | Z | NONE | 0 | INDEX(L=4), LITERAL(Z) |
| . | . | . | . | . |
| . | . | . | . | . |
| . | . | . | . | . |

| Length | Match (L, R) | Next Byte | Operation | Total Length/ Bytes | Selection |
|---|---|---|---|---|---|
| 0 | 2,3 | 0 | Index(2), Index(2) | 24/4 | |
| | | | Literal, Index(3) | 24/4 | X |
| 0 | 2,3 | 1 | Index(2), Index(3) | 27/5 | |
| | | | Literal, Index(4) | 24/5 | X |
| 0 | 2,3 | 2+ | Index(2), Index(4+) | 27/6 | |
| | | | Literal, Index(5+) | 25/6 | X |
| 0 | 3,2 | 0 | Index(3), Literal | 24/4 | |
| | | | Index(2), Index(2) | 24/4 | X |
| 0 | 3,2 | 1 | Index(3), Index(2) | 27/5 | |
| | | | Index(2), Index (3) | 27/5 | X |
| 0 | 3,2 | 2+ | Index(3), Index(3+) | 30/6 | |
| | | | Index(2), Index(4+) | 27/6 | X |
| 0 | 3,3 | 0 | Index(3), Literal | 24/4 | |
| | | | Index(2), Index(2) | 24/4 | |
| | | | Literal, Index(3) | 24/4 | X |
| 0 | 3,3 | 1 | Index(3), Index(2) | 27/5 | |
| | | | Index(2), Index(3) | 27/5 | |
| | | | Literal, Index(4) | 24/5 | X |
| 0 | 3,3 | 2+ | Index(3), Index(3+) | 30/6 | |
| | | | Index(2), Index(4+) | 27/6 | |
| | | | Literal, Index(5+) | 25/6 | X |

FIG. 5A

| Length | Match (L, R) | Next Byte | Operation | Total Length/ Bytes | Selection |
|---|---|---|---|---|---|
| 1 | 1,4 | 0 | Index(2), Index(3)<br>Literal, Index(4) | 27/5<br>24/5 | X |
| 1 | 1,4 | 1 | Index(2), Index(4)<br>Literal, Index(5) | 27/6<br>25/6 | X |
| 1 | 1,4 | 2+ | Index(2), Index(5+)<br>Literal, Index(6+) | 28/7<br>25/7 | X |
| 1 | 2,4 | 0 | Index(3), Index(2)<br>Index(2), Index(3)<br>Literal, Index(4) | 27/5<br>27/5<br>24/5 | X |
| 1 | 2,4 | 1 | Index(3), Index(3)<br>Index(2), Index(4)<br>Literal, Index(5) | 30/6<br>27/6<br>25/6 | X |
| 1 | 2,4 | 2+ | Index(3), Index(4+)<br>Index(2), Index(5+)<br>Literal, Index(6+) | 30/7<br>28/7<br>25/7 | X |
| 1 | 2,3 | 0 | Index(3), Index(2)<br>Index(2), Index(3) | 27/5<br>27/5 | X |
| 1 | 2,3 | 1 | Index(3), Index(3)<br>Index(2), Index(4) | 30/6<br>27/6 | X |
| 1 | 2,3 | 2+ | Index(3), Index(4+)<br>Index(2), Index(5+) | 30/7<br>28/7 | X |
| 1 | 3,2 | 0 | Index(4), Literal<br>Index(3), Index(2) | 24/5<br>27/5 | X |
| 1 | 3,2 | 1 | Index(4), Index(2)<br>Index(3), Index(3) | 27/6<br>30/6 | X |
| 1 | 3,2 | 2+ | Index(4), Index(3+)<br>Index(3), Index(4+) | 30/7<br>30/7 | X |
| 1 | 3,3 | 0 | Index(4), Literal<br>Index(3), Index(2)<br>Index(2), Index(3) | 24/5<br>27/5<br>27/5 | X |
| 1 | 3,3 | 1 | Index(4), Index(2)<br>Index(3), Index(3)<br>Index(2), Index(4) | 27/6<br>30/6<br>27/6 | X |
| 1 | 3,3 | 2+ | Index(4), Index(3+)<br>Index(3), Index(4+)<br>Index(2), Index(5+) | 30/7<br>30/7<br>28/7 | X |
| 1 | 3,4 | 0 | Index(4), Literal<br>Index(3), Index(2)<br>Index(2), Index(3)<br>Literal, Index(4) | 24/5<br>27/5<br>27/5<br>24/5 | X |
| 1 | 3,4 | 1 | Index(4), Index(2)<br>Index(3), Index(3)<br>Index(2), Index(4)<br>Literal, Index(5) | 27/6<br>30/6<br>27/6<br>25/6 | X |
| 1 | 3,4 | 2+ | Index(4), Index(3+)<br>Index(3), Index(4+)<br>Index(2), Index(5+)<br>Literal, Index(6+) | 30/7<br>30/7<br>28/7<br>25/7 | X |

FIG. 5B

| Length | Match (L, R) | Next Byte | Operation | Total Length/ Bytes | Selection |
|---|---|---|---|---|---|
| 2 | 1,4 | 0 | Index(3), Index(3) | 30/6 | |
| | | | Index(2), Index(4) | 27/6 | X |
| 2 | 1,4 | 1 | Index(3), Index(4) | 30/7 | |
| | | | Index(2), Index(5) | 28/7 | X |
| 2 | 1,4 | 2+ | Index(3), Index(5+) | 31/8 | |
| | | | Index(2), Index(6+) | 28/8 | X |
| 2 | 2,4 | 0 | Index(4), Index(2) | 27/6 | |
| | | | Index(3), Index(3) | 30/6 | |
| | | | Index(2), Index(4) | 27/6 | X |
| 2 | 2,4 | 1 | Index(4), Index(3) | 30/7 | |
| | | | Index(3), Index(4) | 30/7 | |
| | | | Index(2), Index(5) | 28/7 | X |
| 2 | 2,4 | 2+ | Index(4), Index(4+) | 30/8 | |
| | | | Index(3), Index(5+) | 31/8 | |
| | | | Index(2), Index(6+) | 27/8 | X |
| 2 | 2,3 | 0 | Index(4), Index(2) | 27/6 | X |
| | | | Index(3), Index(3) | 30/6 | |
| 2 | 2,3 | 1 | Index(4), Index(3) | 30/7 | X |
| | | | Index(3), Index(4) | 30/7 | |
| 2 | 2,3 | 2+ | Index(4), Index(4+) | 30/8 | X |
| | | | Index(3), Index(5+) | 31/8 | |
| 2 | 3,2 | 0 | Index(5), Literal | 25/6 | X |
| | | | Index(4), Index(2) | 27/6 | |
| 2 | 3,2 | 1 | Index(5), Index(2) | 28/7 | X |
| | | | Index(4), Index(3) | 30/7 | |
| 2 | 3,2 | 2+ | Index(5), Index(3+) | 31/8 | |
| | | | Index(4), Index(4+) | 30/8 | X |
| 2 | 3,3 | 0 | Index(5), Literal | 25/6 | X |
| | | | Index(4), Index(2) | 27/6 | |
| | | | Index(3), Index(3) | 30/6 | |
| 2 | 3,3 | 1 | Index(5), Index(2) | 28/7 | X |
| | | | Index(4), Index(3) | 30/7 | |
| | | | Index(3), Index(4) | 30/7 | |
| 2 | 3,3 | 2+ | Index(5), Index(3+) | 31/8 | |
| | | | Index(4), Index(4+) | 30/8 | X |
| | | | Index(3), Index(5+) | 31/8 | |
| 2 | 3,4 | 0 | Index(5), Literal | 25/6 | X |
| | | | Index(4), Index(2) | 27/6 | |
| | | | Index(3), Index(3) | 30/6 | |
| | | | Index(2), Index(4) | 27/6 | |
| 2 | 3,4 | 1 | Index(5), Index(2) | 28/7 | X |
| | | | Index(4), Index(3) | 30/7 | |
| | | | Index(3), Index(4) | 30/7 | |
| | | | Index(2), Index(5) | 28/7 | |
| 2 | 3,4 | 2+ | Index(5), Index(3+) | 31/8 | |
| | | | Index(4), Index(4+) | 30/8 | |
| | | | Index(3), Index(5+) | 31/8 | |
| | | | Index(2), Index(6+) | 28/8 | X |

FIG. 5C

| Length | Match (L, R) | Next Byte | Operation | Total Length/ Bytes | Selection |
|---|---|---|---|---|---|
| 3 | 1,4 | 0 | Index(4), Index(3) <br> Index(3), Index(4) | 30/7 <br> 30/7 | X |
| 3 | 1,4 | 1 | Index(4), Index(4) <br> Index(3), Index(5) | 30/8 <br> 31/8 | X |
| 3 | 1,4 | 2+ | Index(4), Index(5+) <br> Index(3), Index(6+) | 31/9 <br> 31/9 | X |
| 3 | 2,4 | 0 | Index(5), Index(2) <br> Index(4), Index(3) <br> Index(3), Index(4) | 28/7 <br> 30/7 <br> 30/7 | X |
| 3 | 2,4 | 1 | Index(5), Index(3) <br> Index(4), Index(4) <br> Index(3), Index(5) | 31/8 <br> 30/8 <br> 31/8 | X |
| 3 | 2,4 | 2+ | Index(5), Index(4+) <br> Index(4), Index(5+) <br> Index(3), Index(6+) | 31/9 <br> 31/9 <br> 31/9 | X |
| 3 | 2,3 | 0 | Index(5), Index(2) <br> Index(4), Index(3) | 28/7 <br> 30/7 | X |
| 3 | 2,3 | 1 | Index(5), Index(3) <br> Index(4), Index(4) | 31/8 <br> 30/8 | X |
| 3 | 2,3 | 2+ | Index(5), Index(4+) <br> Index(4), Index(5+) | 31/9 <br> 31/9 | X |
| 3 | 3,2 | 0 | Index(6), Literal <br> Index(5), Index(2) | 25/7 <br> 28/7 | X |
| 3 | 3,2 | 1 | Index(6), Index(2) <br> Index(5), Index(3) | 28/8 <br> 31/8 | X |
| 3 | 3,2 | 2+ | Index(6), Index(3+) <br> Index(5), Index(4+) | 31/9 <br> 31/9 | X |
| 3 | 3,3 | 0 | Index(6), Literal <br> Index(5), Index(2) <br> Index(4), Index(3) | 25/7 <br> 28/7 <br> 30/7 | X |
| 3 | 3,3 | 1 | Index(6), Index(2) <br> Index(5), Index(3) <br> Index(4), Index(4) | 28/8 <br> 31/8 <br> 30/8 | X |
| 3 | 3,3 | 2+ | Index(6), Index(3+) <br> Index(5), Index(4+) <br> Index(4), Index(5+) | 31/9 <br> 31/9 <br> 31/9 | X |
| 3 | 3,4 | 0 | Index(6), Literal <br> Index(5), Index(2) <br> Index(4), Index(3) <br> Index(3), Index(4) | 25/7 <br> 28/7 <br> 30/7 <br> 30/7 | X |
| 3 | 3,4 | 1 | Index(6), Index(2) <br> Index(5), Index(3) <br> Index(4), Index(4) <br> Index(3), Index(5) | 28/8 <br> 31/8 <br> 30/8 <br> 31/8 | X |
| 3 | 3,4 | 2+ | Index(6), Index(3+) <br> Index(5), Index(4+) <br> Index(4), Index(5+) <br> Index(3), Index(6+) | 31/9 <br> 31/9 <br> 31/9 <br> 31/9 | X |

FIG. 5D

| Length | Match (L, R) | Next Byte | Operation | Total Length/ Bytes | Selection |
|---|---|---|---|---|---|
| 4 | 1,4 | 0 | Index(5), Index(3) <br> Index(4), Index(4) | 31/8 <br> 30/8 | X |
| 4 | 1,4 | 1 | Index(5), Index(4) <br> Index(4), Index(5) | 31/9 <br> 31/9 | X |
| 4 | 1,4 | 2+ | Index(5), Index(5+) <br> Index(4), Index(6+) | 32/10 <br> 31/10 | X |
| 4 | 2,4 | 0 | Index(6), Index(2) <br> Index(5), Index(3) <br> Index(4), Index(4) | 28/8 <br> 31/8 <br> 30/8 | X |
| 4 | 2,4 | 1 | Index(6), Index(3) <br> Index(5), Index(4) <br> Index(4), Index(5) | 31/9 <br> 31/9 <br> 31/9 | X |
| 4 | 2,4 | 2+ | Index(6), Index(4+) <br> Index(5), Index(5+) <br> Index(4), Index(6+) | 31/10 <br> 32/10 <br> 31/10 | X |
| 4 | 2,3 | 0 | Index(6), Index(2) <br> Index(5), Index(3) | 28/8 <br> 31/8 | X |
| 4 | 2,3 | 1 | Index(6), Index(3) <br> Index(5), Index(4) | 31/9 <br> 31/9 | X |
| 4 | 2,3 | 2+ | Index(6), Index(4+) <br> Index(5), Index(5+) | 31/10 <br> 32/10 | X |
| 4 | 3,2 | 0 | Index(7), Literal <br> Index(6), Index(2) | 25/8 <br> 28/8 | X |
| 4 | 3,2 | 1 | Index(7), Index(2) <br> Index(6), Index(3) | 28/9 <br> 31/9 | X |
| 4 | 3,2 | 2+ | Index(7), Index(3+) <br> Index(6), Index(4+) | 31/10 <br> 31/10 | X |
| 4 | 3,3 | 0 | Index(7), Literal <br> Index(6), Index(2) <br> Index(5), Index(3) | 25/8 <br> 28/8 <br> 31/8 | X |
| 4 | 3,3 | 1 | Index(7), Index(2) <br> Index(6), Index(3) <br> Index(5), Index(4) | 28/9 <br> 31/9 <br> 31/9 | X |
| 4 | 3,3 | 2+ | Index(7), Index(3+) <br> Index(6), Index(4+) <br> Index(5), Index(5+) | 31/10 <br> 31/10 <br> 32/10 | X |
| 4 | 3,4 | 0 | Index(7), Literal <br> Index(6), Index(2) <br> Index(5), Index(3) | 25/8 <br> 28/8 <br> 31/8 | X |
| 4 | 3,4 | 1 | Index(7), Index(2) <br> Index(6), Index(3) <br> Index(5), Index(4) | 28/9 <br> 31/9 <br> 31/9 | X |
| 4 | 3,4 | 2+ | Index(7), Index(3+) <br> Index(6), Index(4+) <br> Index(5), Index(5+) | 31/10 <br> 31/10 <br> 32/10 | X |

FIG. 5E

| Length | Match (L, R) | Next Byte | Operation | Total Length/ Bytes | Selection |
|---|---|---|---|---|---|
| 5 | 1,4 | 0 | Index(6), Index(3) <br> Index(5), Index(4) | 31/9 <br> 31/9 | X |
| 5 | 1,4 | 1 | Index(6), Index(4) <br> Index(5), Index(5) | 31/10 <br> 32/10 | X |
| 5 | 1,4 | 2+ | Index(6), Index(5+) <br> Index(5), Index(6+) | 32/11 <br> 32/11 | X |
| 5 | 2,4 | 0 | Index(7), Index(2) <br> Index(6), Index(3) <br> Index(5), Index(4) | 28/9 <br> 31/9 <br> 31/9 | X |
| 5 | 2,4 | 1 | Index(7), Index(3) <br> Index(6), Index(4) <br> Index(5), Index(5) | 31/10 <br> 31/10 <br> 32/10 | X |
| 5 | 2,4 | 2+ | Index(7), Index(4+) <br> Index(6), Index(5+) <br> Index(5), Index(6+) | 31/11 <br> 32/11 <br> 32/11 | X |
| 5 | 2,3 | 0 | Index(7), Index(2) <br> Index(6), Index(3) | 28/9 <br> 31/9 | X |
| 5 | 2,3 | 1 | Index(7), Index(3) <br> Index(6), Index(4) | 31/10 <br> 31/10 | X |
| 5 | 2,3 | 2+ | Index(7), Index(4+) <br> Index(6), Index(5+) | 31/11 <br> 32/11 | X |
| 5 | 3,2 | 0 | Index(8), Literal <br> Index(7), Index(2) | 25/9 <br> 28/9 | X |
| 5 | 3,2 | 1 | Index(8), Index(2) <br> Index(7), Index(3) | 28/10 <br> 31/10 | X |
| 5 | 3,2 | 2+ | Index(8), Index(3+) <br> Index(7), Index(4+) | 31/11 <br> 31/11 | X |
| 5 | 3,3 | 0 | Index(8), Literal <br> Index(7), Index(2) <br> Index(6), Index(3) | 25/9 <br> 28/9 <br> 31/9 | X |
| 5 | 3,3 | 1 | Index(8), Index(2) <br> Index(7), Index(3) <br> Index(6), Index(4) | 28/10 <br> 31/10 <br> 31/10 | X |
| 5 | 3,3 | 2+ | Index(8), Index(3+) <br> Index(7), Index(4+) <br> Index(6), Index(5+) | 31/11 <br> 31/11 <br> 32/11 | X |
| 5 | 3,4 | 0 | Index(8), Literal <br> Index(7), Index(2) <br> Index(6), Index(3) <br> Index(5), Index(4) | 25/9 <br> 28/9 <br> 31/9 <br> 31/9 | X |
| 5 | 3,4 | 1 | Index(8), Index(2) <br> Index(7), Index(3) <br> Index(6), Index(4) <br> Index(5), Index(5) | 28/10 <br> 31/10 <br> 31/10 <br> 32/10 | X |
| 5 | 3,4 | 2+ | Index(8), Index(3+) <br> Index(7), Index(4+) <br> Index(6), Index(5+) <br> Index(5), Index(6+) | 31/11 <br> 31/11 <br> 32/11 <br> 32/11 | X |

FIG. 5F

| Length | Match (L, R) | Next Byte | Operation | Total Length/ Bytes | Selection |
|---|---|---|---|---|---|
| 6 | 1,4 | 0 | Index(7), Index(3)<br>Index(6), Index(4) | 31/10<br>31/10 | X |
| 6 | 1,4 | 1 | Index(7), Index(4)<br>Index(6), Index(5) | 31/11<br>32/11 | X |
| 6 | 1,4 | 2+ | Index(7), Index(5+)<br>Index(6), Index(6+) | 32/12<br>32/12 | X |
| 6 | 2,4 | 0 | Index(8), Index(2)<br>Index(7), Index(3)<br>Index(6), Index(4) | 28/10<br>31/10<br>31/10 | X |
| 6 | 2,4 | 1 | Index(8), Index(3)<br>Index(7), Index(4)<br>Index(6), Index(5) | 31/11<br>31/11<br>32/11 | X |
| 6 | 2,4 | 2+ | Index(8), Index(4+)<br>Index(7), Index(5+)<br>Index(6), Index(6+) | 31/12<br>32/12<br>32/12 | X |
| 6 | 2,3 | 0 | Index(8), Index(2)<br>Index(7), Index(3) | 28/10<br>31/10 | X |
| 6 | 2,3 | 1 | Index(8), Index(3)<br>Index(7), Index(4) | 31/11<br>31/11 | X |
| 6 | 2,3 | 2+ | Index(8), Index(4+)<br>Index(7), Index(5+) | 31/12<br>32/12 | X |
| 6 | 3,2 | 0 | Index(9), Literal<br>Index(8), Index(2) | 28/10<br>28/10 | X |
| 6 | 3,2 | 1 | Index(9), Index(2)<br>Index(8), Index(3) | 31/11<br>31/11 | X |
| 6 | 3,2 | 2+ | Index(9), Index(3+)<br>Index(8), Index(4+) | 34/12<br>31/12 | X |
| 6 | 3,3 | 0 | Index(9), Literal<br>Index(8), Index(2)<br>Index(7), Index(3) | 28/10<br>28/10<br>31/10 | X |
| 6 | 3,3 | 1 | Index(9), Index(2)<br>Index(8), Index(3)<br>Index(7), Index(4) | 31/11<br>31/11<br>31/11 | X |
| 6 | 3,3 | 2+ | Index(9), Index(3+)<br>Index(8), Index(4+)<br>Index(7), Index(5+) | 34/12<br>31/12<br>32/12 | X |
| 6 | 3,4 | 0 | Index(9), Literal<br>Index(8), Index(2)<br>Index(7), Index(3)<br>Index(6), Index(4) | 28/10<br>28/10<br>31/10<br>31/10 | X |
| 6 | 3,4 | 1 | Index(9), Index(2)<br>Index(8), Index(3)<br>Index(7), Index(4)<br>Index(6), Index(5) | 31/11<br>31/11<br>31/11<br>32/11 | X |
| 6 | 3,4 | 2+ | Index(9), Index(3+)<br>Index(8), Index(4+)<br>Index(7), Index(5+)<br>Index(6), Index(6+) | 34/12<br>31/12<br>32/12<br>32/12 | X |

FIG. 5G

| Length | Match (L, R) | Next Byte | Operation | Total Length/ Bytes | Selection |
|---|---|---|---|---|---|
| 7 | 1,4 | 0 | Index(8), Index(3)<br>Index(7), Index(4) | 31/11<br>31/11 | X |
| 7 | 1,4 | 1 | Index(8), Index(4)<br>Index(7), Index(5) | 31/12<br>32/12 | X |
| 7 | 1,4 | 2+ | Index(8), Index(5+)<br>Index(7), Index(6+) | 32/13<br>32/13 | X |
| 7 | 2,4 | 0 | Index(9), Index(2)<br>Index(8), Index(3)<br>Index(7), Index(4) | 31/11<br>31/11<br>31/11 | X |
| 7 | 2,4 | 1 | Index(9), Index(3)<br>Index(8), Index(4)<br>Index(7), Index(5) | 34/12<br>31/12<br>32/12 | X |
| 7 | 2,4 | 2+ | Index(9), Index(4+)<br>Index(8), Index(5+)<br>Index(7), Index(6+) | 34/13<br>32/13<br>32/13 | X |
| 7 | 2,3 | 0 | Index(9), Index(2)<br>Index(8), Index(3) | 31/11<br>31/11 | X |
| 7 | 2,3 | 1 | Index(9), Index(3)<br>Index(8), Index(4) | 34/12<br>31/12 | X |
| 7 | 2,3 | 2+ | Index(9), Index(4+)<br>Index(8), Index(5+) | 34/13<br>32/13 | X |
| 7 | 3,2 | 0 | Index(10), Literal<br>Index(9), Index(2) | 28/12<br>31/12 | X |
| 7 | 3,2 | 1 | Index(10), Index(2)<br>Index(9), Index(3) | 31/13<br>34/13 | X |
| 7 | 3,2 | 2+ | Index(10),<br>Index(3+)<br>Index(9), Index(4+) | 34/14<br>34/14 | X |
| 7 | 3,3 | 0 | Index(10), Literal<br>Index(9), Index(2)<br>Index(8), Index(3) | 28/11<br>31/11<br>31/11 | X |
| 7 | 3,3 | 1 | Index(10), Index(2)<br>Index(9), Index(3)<br>Index(8), Index(4) | 31/12<br>34/12<br>34/12 | X |
| 7 | 3,3 | 2+ | Index(10),<br>Index(3+)<br>Index(9), Index(4+)<br>Index(8), Index(5+) | 34/12<br>34/12<br>32/12 | X |
| 7 | 3,4 | 0 | Index(10), Literal<br>Index(9), Index(2)<br>Index(8), Index(3)<br>Index(7), Index(4) | 28/11<br>31/11<br>31/11<br>31/11 | X |
| 7 | 3,4 | 1 | Index(10), Index(2)<br>Index(9), Index(3)<br>Index(8), Index(4)<br>Index(7), Index(5) | 31/12<br>34/12<br>31/12<br>32/12 | X |
| 7 | 3,4 | 2+ | Index(10),<br>Index(3+)<br>Index(9), Index(4+)<br>Index(8), Index(5+)<br>Index(7), Index(6+) | 34/13<br>34/13<br>32/13<br>32/13 | X |

FIG. 5H

| Length | Match (L, R) | Next Byte | Operation | Total Length/ Bytes | Selection |
|---|---|---|---|---|---|
| 8 | 1,4 | 0 | Index(9), Index(3) | 34/12 | |
| | | | Index(8), Index(4) | 31/12 | X |
| 8 | 1,4 | 1 | Index(9), Index(4) | 34/13 | |
| | | | Index(8), Index(5) | 32/13 | X |
| 8 | 1,4 | 2+ | Index(9), Index(5+) | 35/14 | |
| | | | Index(8), Index(6+) | 32/14 | X |
| 8 | 2,4 | 0 | Index(10), Index(2) | 31/12 | |
| | | | Index(9), Index(3) | 34/12 | |
| | | | Index(8), Index(4) | 31/12 | X |
| 8 | 2,4 | 1 | Index(10), Index(3) | 34/13 | |
| | | | Index(9), Index(4) | 34/13 | |
| | | | Index(8), Index(5) | 32/13 | X |
| 8 | 2,4 | 2+ | Index(10), Index(4+) | 34/14 | |
| | | | | 33/14 | |
| | | | Index(9), Index(5+) | 32/14 | |
| | | | Index(8), Index(6+) | | X |
| 8 | 2,3 | 0 | Index(10), Index(2) | 31/12 | X |
| | | | Index(9), Index(3) | 34/12 | |
| 8 | 2,3 | 1 | Index(10), Index(3) | 34/13 | X |
| | | | Index(9), Index(4) | 34/13 | |
| 8 | 2,3 | 2+ | Index(10), Index(4+) | 34/14 | |
| | | | Index(9), Index(5+) | 32/14 | X |
| 8 | 3,2 | 0 | Index(11), Literal | 28/12 | X |
| | | | Index(10), Index(2) | 31/12 | |
| 8 | 3,2 | 1 | Index(11), Index(2) | 31/13 | X |
| | | | Index(10), Index(3) | 34/13 | |
| 8 | 3,2 | 2+ | Index(11), Index(3+) | 34/14 | X |
| | | | Index(10), Index(4+) | 34/14 | |
| 8 | 3,3 | 0 | Index(11), Literal | 28/12 | X |
| | | | Index(10), Index(2) | 31/12 | |
| | | | Index(9), Index(3) | 34/12 | |
| 8 | 3,3 | 1 | Index(11), Index(2) | 31/13 | X |
| | | | Index(10), Index(3) | 34/13 | |
| | | | Index(9), Index(4) | 34/13 | |
| 8 | 3,3 | 2+ | Index(11), Index(3+) | 34/14 | X |
| | | | Index(10), Index(4+) | 34/14 | |
| | | | Index(9), Index(5+) | 35/14 | |
| 8 | 3,4 | 0 | Index(11), Literal | 28/12 | X |
| | | | Index(10), Index(2) | 31/12 | |
| | | | Index(9), Index(3) | 34/12 | |
| | | | Index(8), Index(4) | 31/12 | |
| 8 | 3,4 | 1 | Index(11), Index(2) | 31/13 | X |
| | | | Index(10), Index(3) | 34/13 | |
| | | | Index(9), Index(4) | 34/13 | |
| | | | Index(8), Index(5) | 32/13 | |
| 8 | 3,4 | 2+ | Index(11), Index(3+) | 34/14 | |
| | | | Index(10), Index(4+) | 34/14 | |
| | | | | 35/14 | |
| | | | Index(9), Index(5+) | 32/14 | X |

FIG. 5I

| RS Length | Match 1,4 | Match 2,4 | Match 2,3 | Match 3,2 | Match 3,3 | Match 3,4 |
|---|---|---|---|---|---|---|
| 0 | - | - | New (5) | New (3) | New (8) | - |
| 1 | New (8) | New (13) | New (5) | Old (6) | Old (1) | New (7) |
| 2 | New (8) | New (5) | Old (4) | Old (3) | Old (6) | New (1) |
| 3 | Old (1) | Old (2) | Old (1) | Old (6) | Old (7) | Old (8) |
| 4 | New (2) | Old (2) | Old (4) | Old (6) | Old (10) | Old (10) |
| 5 | Old (1) | Old (5) | Old (4) | Old (6) | Old (10) | Old (11) |
| 6 | Old (1) | Old (5) | Old (4) | New (3) | New (3) | New (3) |
| 7 | Old (1) | New (5) | New (5) | Old (6) | Old (4) | Old (2) |
| 8 | New (8) | New (4) | Old (1) | Old (6) | Old (10) | Old (2) |

FIG. 6

| RS Length | Match (center, right) | Next Byte | Operation | Total Length/ Bytes | Selection |
|---|---|---|---|---|---|
| - | 2,2 | 0 | Index(2), Literal | 21/3 | |
|   |     |   | Literal, Index(2) | 21/3 | X |
| - | 2,2 | 1 | Index(2), Index(2) | 24/4 | |
|   |     |   | Literal, Index(3) | 24/4 | X |
| - | 2,2 | 2 | Index(2), Index(3) | 27/5 | |
|   |     |   | Literal, Index(4) | 24/5 | X |
| - | 2,2 | 3+ | Index(2), Index(4+) | 27/6 | |
|   |     |   | Literal, Index(5+) | 25/6 | X |

EVALUATING ALTERNATIVE ENCODING SOLUTIONS DURING DATA COMPRESSION

SUMMARY

Various embodiments of the present invention are generally directed to a method and apparatus for compressing data.

In accordance with various embodiments, an input string of data bits is arranged into fixed-sized chunks. Multiple successive chunks of the input string are compared to previously received chunks of the input string during a single clock cycle. At least two alternative encoding solutions are identified based on matches obtained during said comparison. The input string is compressed to form a compressed output string using a selected one of the at least two alternative encoding solutions that achieves a fewer number of bits in said output string.

These and other features and advantages which characterize the various embodiments of the present invention can be understood in view of the following detailed discussion and the accompanying drawings.

BRIEF DESCRIPTION OF THE DRAWINGS

FIGS. 5A-5I show alternative encoding solutions for various run lengths of data matches.
FIG. 6 summarizes the data from FIGS. 5A-5I.
FIG. 7 provides additional inter-chunk comparison options.

DETAILED DESCRIPTION

The present disclosure generally relates to data compression. Lossless data compression can be carried out by encoding an input string of data to provide an encoded output string of data that is reduced in size as compared to the size of the original input data. This reduction in size can be obtained by identifying recurring patterns (e.g., bytes) in the input string and representing these subsequently occurring patterns using an index notation.

By way of illustration, consider an input string A, B, B, B. This string could be encoded using a particular compression methodology as an encoded output string L(A), I(B3). L(A) represents the literal input character A, and I(B3) is an index which signifies that there are three successive occurrences of the character B in the input string. Generally, any encoded output string will require fewer bits than the unencoded input string if the index require fewer bits than the literal input characters represented by the index.

In the above example, assume each literal requires 8 bits and each index requires 16 bits. The input string would constitute 32 bits (4×8), the compressed output string would constitute 24 bits (8+16), and the compression rate could be calculated as 25% (1−24/32). Depending on the input data and the compression algorithm, exemplary lossless compression rates may be on the order of less than about 10% to 50% or more.

Generally, better compression rates may be achieved if more effort is taken in analyzing the input data, such as through the use of a wider or deeper cache of history data. Such detailed analyses may take longer in terms of elapsed time, however, and this can adversely affect data throughput rates. Faster speed may be achieved using a compression scheme that provides less than optimum compression rates.

These two goals of data compression, faster throughput versus compression efficiency, are often at odds with one another. As explained below, various embodiments of the present invention are generally directed to gaining the benefits of both approaches in a single data compression methodology.

Figure 1:
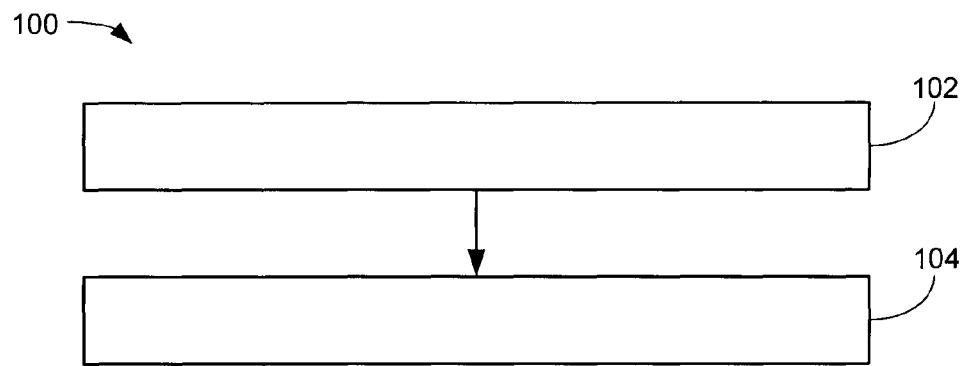
FIG. 1 shows a data handling system.

FIG. 1 provides a simplified functional block representation of a data handling system 100 in accordance with some embodiments. The system 100 includes respective modules 102, 104 which communicate as shown. The data handling system 100 and the respective modules 102, 104 can take any number of forms, including but not limited to a data storage system, a communication system, a data processing system, a personal computer, etc. No transfer of data is necessarily required, so module 104 is optional.

Figure 2:
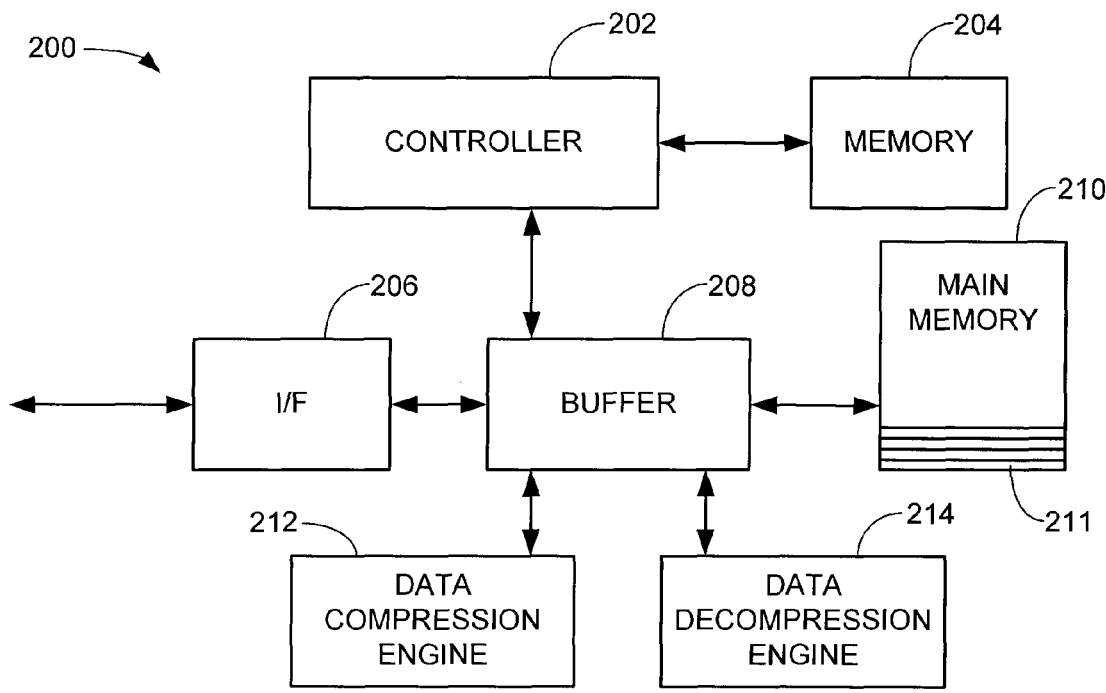
FIG. 2 illustrates a data storage system.

FIG. 2 shows a data storage system 200 in accordance with some embodiments. The system 200 can be characterized as a solid state drive (SSD). A controller 202 uses programming in local memory 204 to provide top level control of data transfers with a host device. An interface circuit (I/F) 206 and buffer 208 provide a data path between the host and a main memory 210, which may comprise a non-volatile data storage array (such as Flash memory). The main memory 210 can be arranged as a number of pages 211 of memory. The pages may be arranged as rows (or columns) of memory cells, such as 4096 bytes per page, that can be written and/or read in a page mode operation.

A data compression engine 212 operates to compress input data prior to storage in the array 210. A data decompression engine 214 decompresses stored data prior to retrieval to the host. The respective engines 212, 214 can be realized in hardware and/or in programming utilized by the controller 202.

Figures 3, 4:
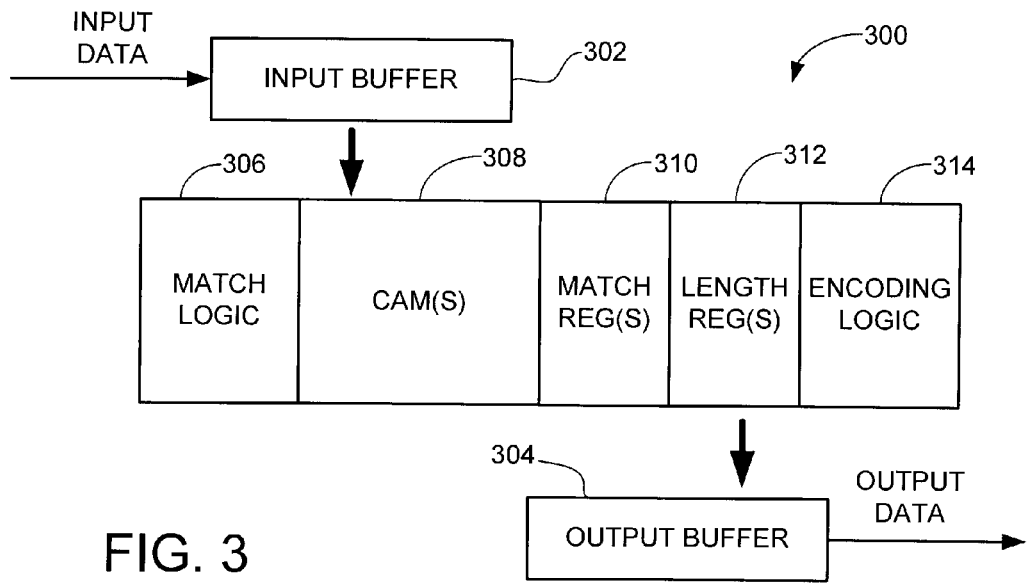
FIG. 3 provides a data compression system.
FIG. 4 illustrates data compression using the system of FIG. 3.

FIG. 3 shows a data compression engine 300 in accordance with some embodiments to apply data compression to a string of input data. The engine 300 can be utilized in the data storage system 200 of FIG. 2 to perform on-the-fly compression of data received by the host prior to storage in main memory, although such is not limiting.

Uncompressed input data are streamed to an input buffer 302, compressed, and passed to an output buffer 304 for downstream transfer. The output data rate nominally matches the input data rate, although in some embodiments the output rate may differ from the input data rate. One or more content addressable memories (CAMs) 308 are used to provide a history buffer of the input data. The CAM depth (number of entries in the CAM) can be any suitable length, such as 1024 entries, 4096 entries, etc. A larger number of entries in the CAM can provide better compression performance since there will be a larger number of possible matches based on previously occurring entries.

The CAM width (number of bits in each entry) can be any suitable chunk size of the input data. In the present example, each chunk will constitute an 8-bit byte of the input data. Other sizes of chunks of data can be selected as desired (e.g., 2-bytes, 4-bytes, 12 bits, etc.). Smaller CAM widths can promote better compression performance since fewer numbers of bits tend to provide higher numbers of matches.

The input bytes are successively added as CAM entries in an incrementally increasing fashion beginning at address 0 (first entry of the CAM). Once the CAM is full, further entries overwrite the previously stored data beginning at address 0 to provide a rolling history. Other types of associative memories can be utilized to form the history buffer besides a CAM structure.

CAMs and other associative memories are configured to allow a simultaneous search of all stored entries via one or more match lines over a single clock cycle, irrespective of CAM depth. Match logic 306 is provided to facilitate multiple byte (chunk) match operations on the history buffer entries during the same clock cycle. In the present example, it is contemplated that four (4) separate bytes per clock cycle will be searched for matches, although other numbers of chunks per clock cycle can be searched.

Match registers 310 are used to record matches between the input bytes and the history buffer entries. Length registers 312 record lengths of strings of consecutive matches. The match and length registers 310, 312 each have a depth equal to the depth of the associated CAM 308. Encoding logic 314 operates to utilize the information recorded in the match and length registers 310, 312 to provide the output compressed data.

In accordance with various embodiments, from time to time the matching operation will identify multiple alternative encoding solutions. From these, the encoding logic 314 will select a solution that provides a fewer number of bits in the output data as compared to other alternative solutions. In this way, optimum encoding selections can be made to provide improved data compression rates.

To explain this operation, reference is made to FIG. 4 which shows relevant portions of the compression system of FIG. 3. Data are arranged in various columns including CAM address, CAM entries, match vectors, length vectors, and output data string. An exemplary input data sequence is defined as (A, B, C, D, X, A, Y, A, B, C, D, Z . . . ) where each character in the sequence represents an 8-bit byte. For each character in turn, a search of the CAM entries is made, any matches and associated run lengths are identified, and the character is appended to the CAM.

As can be seen from FIG. 4, no matches were established for the first five inputs (A, B, C, D, X). The outputs generated responsive to these inputs were the literal values of these characters. The second occurrence of the character A in the input sequence is shown at address 5 of the CAM. This second A results in a CAM match with the first A at address 0, and initiates a sequence run of length 1. The output string is delayed to see whether the next character (Y) also provides a match, allowing the run length to be extended. Since it does not, literals are output for A and Y.

It will be noted in the exemplary compression scheme, it requires fewer bits to represent the literal A than to provide an index to represents the single second occurrence of A. Other schemes may provide shorter indexes, in which case the second A could be alternatively represented by an index using less than 8 bits.

The next four characters A, B, C and D provide a sequence of matches; the A at address 7 matches the As at addresses 0 and 5, the B at address 8 matches the B at address 1, the C at address 9 matches the C at address 2, and the D at address 10 matches the D at address 3. This provides incremental runs length of 1, 2, 3 and 4, and no outputs are generated during these matches pending conclusion of the run. The next character Z at address 11 provides no CAM matches, so the run is concluded and an index of length 4 is output to represent the run ABCD, followed by a literal Z.

The match for the A at address 7 is identified as a CAM match, whereas the matches for the B, C and D at addresses 8-10 are identified as ShiftMatches. The ShiftMatch notation signals an ongoing run; that is, the sequence of separate characters A, B, C, D has been duplicated in the input data. The ShiftMatch operation detects any previous CAM Match, of any length, where the current input chuck matches the next location and incrementally increases the match length.

In the simplified example of FIG. 4 it can be seen that it is possible to have matches at multiple addresses in the CAM, and multiple ShiftMatches that have the same sequence in the CAM multiple times. This may result in multiple alternative encoding solutions.

For example, instead of outputting the length 4 index for ABCD followed by a literal Z, the scheme could have alternatively output two indexes of length two (AB and CD) followed by the literal Z. This could be advantageous if the combined length of the two indexes (AB and CD) is less than the length of a single, longer index for the entire string (ABCD). The encoding logic selects the optimum solution based on a number of factors, such as which solution provides fewer bits in the output stream. Other factors can be taken into account as well, such as which solution provides a better opportunity for an upcoming match run.

Two match registers (310, FIG. 3) are used to keep track of the CAM matches and the ShiftMatches. The first register is a vector that is the same size as the depth of the CAM. This register, referred to as RS, will be set for each CAM match, or ShiftMatch, no matter the length, and indicates the location of the current match or match string. The length register(s) 312 will store values that indicate the current match string length.

The disclosed encoding scheme obtains the high compression rate performance of a smaller width CAM, while maintaining higher throughput rates by processing multiple bytes of data in each cycle. The design is usable with a wider CAM and still it is possible to process any number of CAM width blocks in a single clock cycle. The larger the number of bytes processed in a clock cycle, generally the more complex the design.

Regardless of how many bytes are processed in a cycle, a CAM match operation is carried out for each byte that is processed, and a separate match operation is carried out to detect matches within the bytes. For example, if the incoming bytes are (A, A), a CAM match will be carried out to compare the incoming bytes to the history buffer entries in the CAM. An additional match operation will check to see if the second byte matches the first. Each CAM match produces a match vector.

During each cycle, a ShiftMatch operation is carried out to detect continuous runs. In the case of two bytes per cycle, there may be three ShiftMatch operations, RS+1, RS+2, and Match0+Match1 where RS+n increments (or decrements) along the RS register, and Match0 and Match1 indicate the presence (or absence) of CAM matches for the respective input bytes. Depending on convention, a match may be represented by logical 1 and no match may be represented by logical 0, with additional bits representing address of the match. Additionally or alternatively, a multibit representation of the address of the matched entry can be used. The match and ShiftMatch result vectors are used to produce an updated RS vector, as well as used to generate any index or literals for the compressed output stream.

To obtain the same results as a single byte wide compression, the largest RS+n matches can be used first (e.g., RS+2 rather than RS+1), followed by the processing of any leftover bytes (ShiftMatch with other match runs) afterwards.

In the case of four or more byte operations per cycle, it is possible to choose which order to compress the bytes due to the ability to implement a look ahead operation with the extra bytes processed in the cycle. As discussed above, this may result in multiple alternative compression solutions. Based on the look ahead operation, it may be possible to take a smaller RS+n match and leave the cycle with a 2+ byte match going into the next cycle. For example, consider the following vectors during a given four byte/cycle operation:

$RS+1=1$ $RS+2=1$ $RS+3=1$ $RS+4=0$

Match3+Match4=1

Match4=1

Others don't care. (1)

One byte/cycle equivalent processing would process RS+3 (largest RS+n as discussed above) followed by the Match4 match, resulting in a compression output of:

Index(len+3),set len=1,RS=Match4 vector (2)

An alternative solution would be to process RS+2 followed by the Match3+Match4 match, resulting in a compression output of Index(len+2),set len=2,RS=Match3+Match4 vector (3)

In the former case (solution (2)), the index generated is of one longer byte, and the cycle is concluded with a single length match. It is possible that the next byte will not generate a continue match (RS+1). Thus, there is a good chance that the continue match would end up being output as a literal.

In the latter case (solution (3)), an index is generated without the one longer byte, but the cycle is left with a two length match. Worst case, the next byte does not result in a match, but the result is still a length two compression instead of a literal. Thus, a shorter compression solution is selected and the chances of continuing a match run is maintained.

The system operates to optimize around the match length encoding information to reduce the number of bits used to encode the two match strings. This optimization could be done at every point where there is a boundary in the length encoding. In practice, it has been determined in some applications that there may be a diminished rate of return for length encoding that extends beyond the width of the CAM (e.g., lengths of runs greater than 8).

FIGS. 5A-5I present a series of tables of possible alternative solutions for different run lengths under different scenarios using an encoding system such as shown in FIGS. 3-4. The tables illustrate runs of length 0 in FIG. 5A to runs of length 8 in FIG. 5I. The example system uses a 1024 entry CAM with a 10 bit pointer in the index values, and a selected Lempel-Ziv (LZ) compression notation. It will be appreciated that different solutions may arise if a different size CAM and/or a different compression notation (e.g., Huffman encoding, etc.) are used, so the solutions presented in the tables are exemplary and not limiting.

The nomenclature used in the tables is provided as pairs of numbers. The first number in each pair is the match string length starting from the left, and the second number is the match string length starting from the right. As an example, 3 2 indicates that there is a match run Match0-Match2 and a run Match2-Match3.

The decisions on which solutions provide overall numbers of bits are based on the size of the literals and the various index lengths. In the present case, it is contemplated that each literal constitutes 9 bits to express. Indexes vary based on length of run, as follows:

Index length 2–12 bits

Index length 3–15 bits

Index length 4–15 bits

Index length>4–>15 bits (4)

RS length indicates the length of the current matching string. Match (left, Right) indicates the number of bytes that match from the left and from the right, respectively. Next Byte indicates that the next byte from the next 32-bit input value matches the previous byte. Operation signifies the two (or more) alternative ways in which the RS and Match data can be combined for encoding solutions. The Total Length/Bytes column signifies the associated total lengths of the encoding solutions in the Operation column. The Selection column places an "X" next to the shortest solution, indicative of operation by the associated encoding logic to select the shortest solution. It will be appreciated that the tables are relatively long to show detailed alternative solutions for RS lengths up to 8.

FIG. 5A shows entries for RS length 0. The first row in the table contemplates the situation where Match (L, R) is 2, 3 and the Next Byte is 0 (that is, there is no match in the upcoming data). Two separate encoding solutions are identified: the first solution uses two indexes (Index(2), Index (2)), and the second solution uses a literal followed by an index (Literal, Index (3)). Both solutions provide encoded output of the same length (24 bits/4 bytes) based on the convention provided above. Thus, either solution could be selected based on length, and one solution may be chosen over the other based on other factors.

The last row in the table of FIG. 5A provides Match (L, R) of 3,3, and a Next Byte of 2+ (two or more upcoming bytes match the currently matched bytes). In this case, three alternative solutions are identified. The first solution is to encode the data as Index(3), Index(3+). The second solution is to encode Index(2), Index(4+). The third solution is to provide a literal followed by an Index(5+). Other solutions may exist as well. Each solution provides different total numbers of bits, with the third alternative being the shortest (25/6). The encoder logic selects and outputs the third solution encoding format on this basis. The remaining tables in FIGS. 5B-5I can be evaluated in a similar fashion.

FIG. 6 provides a table that summarizes the results of the tables in FIGS. 5A-5I. The New/Old column indicates if the optimum solution is based on New encoding (Right side match string takes priority) or Old encoding (Left side match strings take priority). The number in parenthesis is the number of bits saved, total of all combinations, by using the selected scheme.

In addition to the analysis in FIGS. 5-6, further analysis can be carried out on matches that do not continue a run from the previously processed data, but nevertheless include two runs. For example, one run may be Match1-Match2 and the other Match2-Match3. In another example, there may be a continuation run of RS+1. These types of results are exemplified in FIG. 7.

Figure 8:
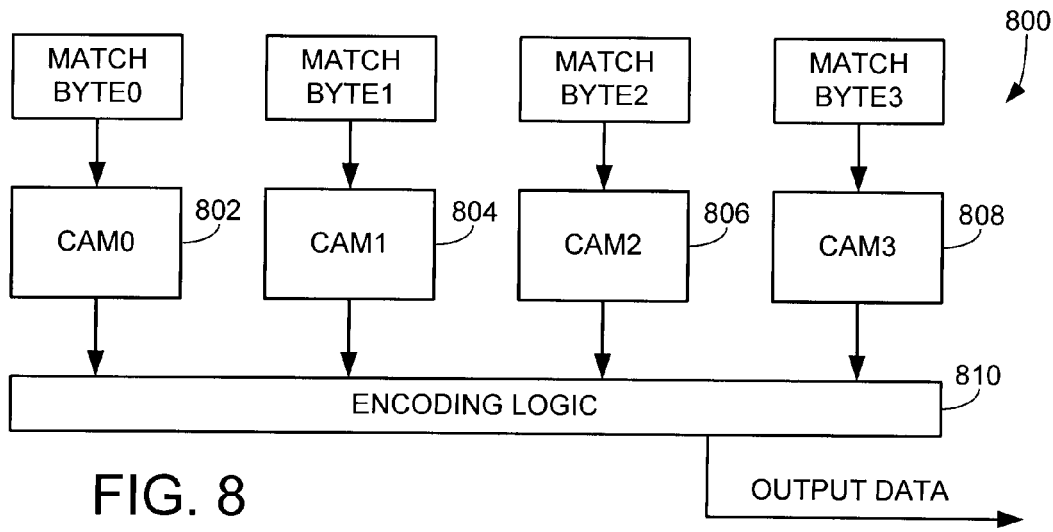
FIG. 8 illustrates another data compression system.

FIG. 8 shows another compression system 800 in accordance with some embodiments to carry out the foregoing types of operations. Four separate physical CAM structures 802, 804, 806 and 808 are utilized to concurrently carry out CAM matches on four input bytes during each clock cycle. Matches are accumulated using match logic and registers as discussed above. The resulting match and run length vectors are supplied to encoding logic 810, which operates to identify various compression solutions and to select an optimum solution when multiple solutions are available for a given set of input bytes. Each of the CAMs are of the same size and history data is concurrently loaded to each at the end of each cycle. FIG. 8 is a hardware based solution, although the encoding logic can be implemented in hardware or firmware. While four CAM structures are shown, any number n can be used as required.

Figure 9:
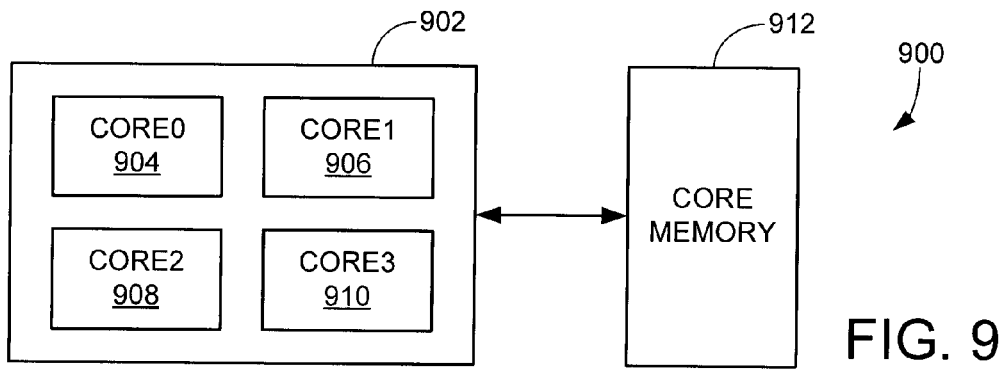
FIG. 9 shows yet another data compression system.

FIG. 9 shows another compression system 900 realized in firmware (or software). In FIG. 9, a quad-core processor 902 has separate cores 904, 906, 908 and 910 which separately operate to concurrently execute the matching and analysis functions of FIG. 8. A core memory 912, such as a local cache or local memory with matching capabilities, stores the CAM entries and vectors. A single set of history data, or multiple duplicate sets of the history data, can be maintained in the core memory 912 based on the manner in which the memory is mapped to and accessed by the respective cores. This design provides a relatively powerful encoding solution that can run at the maximum core processor clock speed.

The design of the CAM or other associative memory structure used to store the history data can take a variety of forms. Some embodiments use a CAM width of one byte and a CAM depth of 1024 entries. Four separate CAMs can be used as shown in FIG. 8, or a single CAM can be used to facilitate multiple concurrent searches such as through the use of separate match lines to the same entries. The ability to update multiple entries concurrently and in the proper order reduces delays in processing.

In at least some embodiments, the matching logic will be duplicated for each search byte, and each matching logic will generate a separate 1024-bit vector that indicates where that byte matches the data in the CAM. The matching logic will further facilitate inter-byte match searches among the various bytes. For example, if there is an empty CAM, the write address is 0, and the input data string bytes are (A, B, A, B), the first two bytes may have a zero matching vector. The last two bytes may initially have a zero matching vector but would be updated, based on the write address, to match locations 0 and 1 respectively. This would end as the beginning of a string with a current length of two.

Once the four respective matching vectors are created, such are used along with the RS vector to determine the matching runs for compression strings. These runs include the RS+Match0 up to RS+Match4 (all four matches continue the string), but also include new runs that can be of length 2, 3, or 4 from the new data sets. All of these runs are identified as separate new run vectors to indicate the location of the runs. After all of the runs matching is completed, the resultant vectors are used to generate the compression output.

In some embodiments using a 32-bit processing core, the maximum number of encodings in a cycle will be five, with a maximum of two indexes or a maximum of five literals. The indexes are not always in the same locations, but can be in almost any combination in the first three locations. It may be common to have multiple literals in that they are just the input bit with a pre-pended literal indicator. Because the locations of the literals and indexes can be mixed, it may be beneficial to have two index encoders and then some indication of which location that the output is placed. In addition, there may be provision for a valid signal to signal the appending of literals to the output stream. The encoding logic can take the index/literal encoder output and shuffle the order into a shifting register for output as a 32-bit or 64-bit output stream.

For timing reasons, it may be efficient to arrange the CAM(s) as one stage, the encoders and shuffle logic as a second stage and a shifter to the output buffer (e.g., FIFO) as a third stage. This will separate all of the CAM timing path logic from the index encoder logic, and may only require about 60 flops to pipeline the operation.

Figure 10:
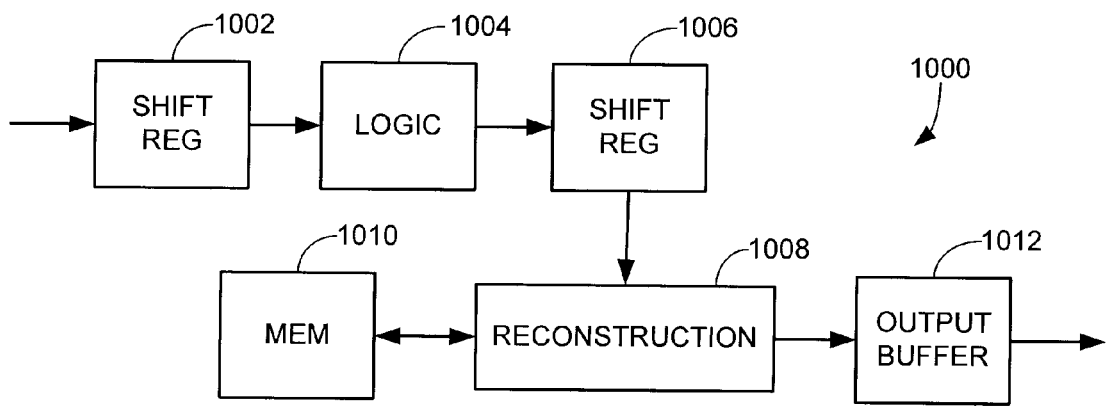
FIG. 10 shows a data decompression system.

Decompression of the previously compressed data can be carried out in any number of suitable ways. A pipeline structure may be provided that can support up to four values in a cycle with a maximum of two indexes and four literals. It is possible to have the indexes in any of the first three locations. A multi-stage decoder may be employed such as shown at 1000 in FIG. 10.

A first stage in the decoder 1000 constitutes an input shift register 1002. The register receives and combines the incoming data into a continuous stream for the different decoders. This stage can be characterized as a flopping stage. A combinatorial logic stage 1004 receives the data from the shift register 1002 and is used to decode up to 4 indexes and literals (any mixture) in a given cycle. The output of this stage will be an indicator, pointer and length, or an indicator and byte.

A second shift register 1006 constitutes a third stage of the decoder. The register 1006 can be configured to store eight entries where each entry is large enough to handle the largest output from the logic stage 1004. This splits the decoded values into fixed size chunks for use by the rest of the logic. This stage is also a flopping stage.

A reconstruction module 1008, which can be realized in hardware or firmware, receives up to four entries at a time from the shift register 1006 and performs a memory look-up, for indexes, or move the byte, for literals to an output buffer 1010. The module 1008 support the writing of all the four bytes that are being moved out during each operation, and indicates to the upstream shift register 1006 how many items have been consumed. Decoder memory 1012 can also be provided that supports four independent reads and four independent write operations in each cycle. This memory can be implemented as a flop based array.

Figure 11:
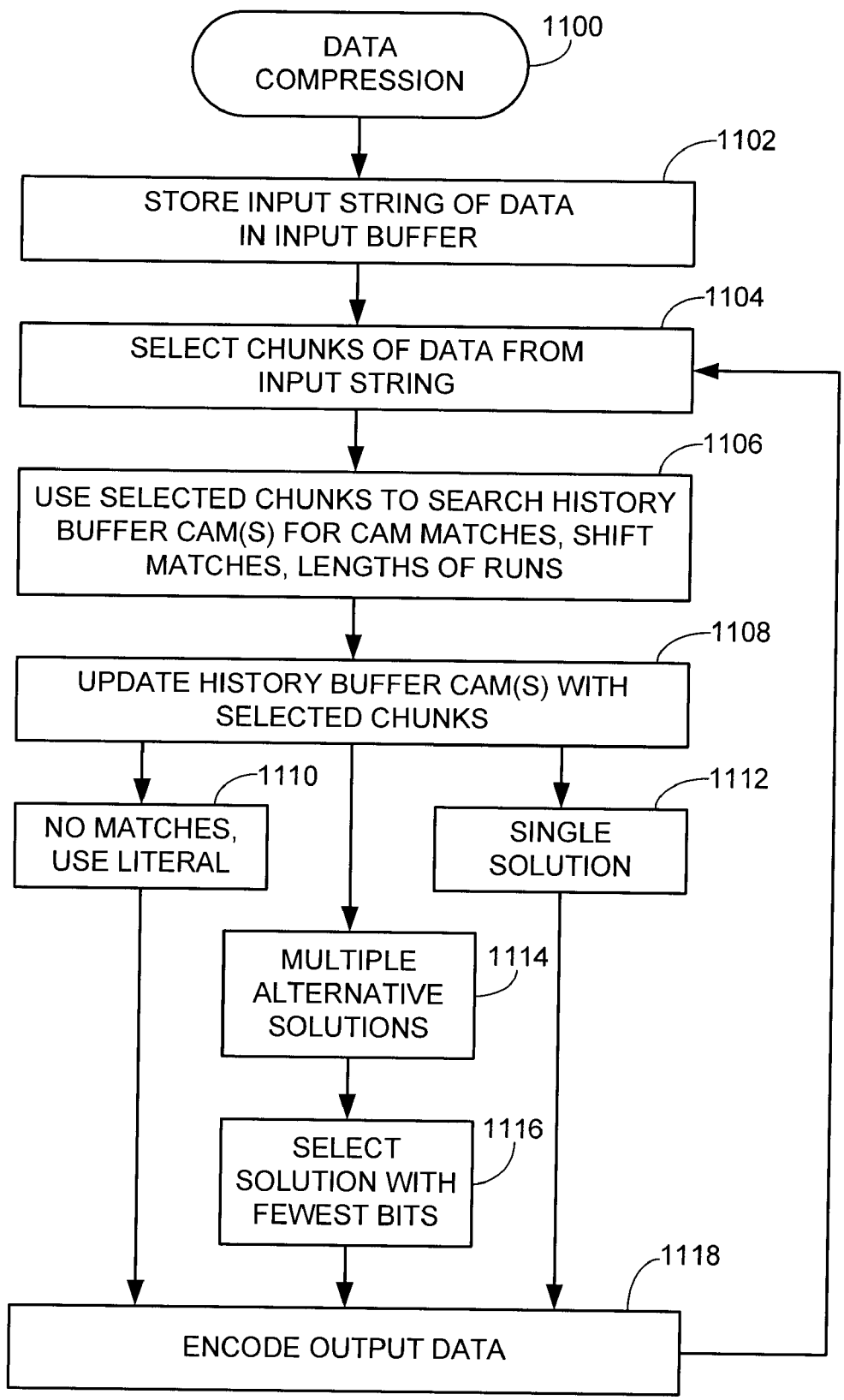
FIG. 11 is a flow chart for a DATA COMPRESSION routine illustrative of steps carried out in accordance with various embodiments of the present invention.

FIG. 11 provides a flow chart for a DATA COMPRESSION routine 1100 illustrative of steps carried out in accordance with various embodiments of the present invention. The routine can be carried out in any number of environments including those of FIGS. 1-3 and 8-9. At step 1102, data from an input string are temporarily stored and made available in an input buffer. The data are divided into fixed-sized chunks, such as in 8-bit bytes. A selected number of successive chunks (bytes), such as four, are identified from the input string at step 1104.

The selected chunks are used in step 1106 to search a history buffer to identify CAM matches, ShiftMatches and run lengths (RS vectors) in a manner as described above, and are carried out over a single clock cycle. After the searching of step 1106, the selected chunks are appended to the history buffer as new entries in step 1108 and will thereafter be part of the search population for successive chunk searches until the chunks are overwritten with new data.

It is contemplated that at least three alternative situations will arise from the searching carried out during step 1106; no encoding solution will be identified based on the fact that there are no matches or runs, as indicated by step 1110; a single encoding solution will be identified, as indicated by step 1112, or multiple alternative encoding solutions will be identified, as indicated by step 1114. It will be appreciated that if an ongoing run is detected, the system may elect to delay encoding until the next set of chunks is applied. For purposes herein, outputting the literal input data does not constitute an encoding solution; rather, for purposes herein each encoding solution will be understood to comprise at least one index that encodes the input literal data. Such encoding may include address and length data associated with the corresponding literal(s).

When multiple alternative encoding solutions are present, the flow passes from step 1114 to step 1116 where the encoding solution that provides a fewer number of bits of compressed data is selected, after which the data are encoded at step 1118. The routine then passes back to step 1104 to analyze the next grouping of input data chunks, and continues until all data have been compressed and an end of sequence (EOS) marker is appended.

It will now be appreciated that the various embodiments presented above may provide enhanced data compression performance. Any number of different styles of compression notation can be used, and the compression can be extended to any size chunks. In the environment of an SSD, the compressed data can be carried out on an LBA basis to provide variable length compressed LBAs that are wrapped along available pages (e.g., rows) of memory cells. The compression and decompression of the data can be carried out in hardware, firmware, software, or various combinations thereof. An exemplary listing of psuedocode for a 32-bit firmware solution is provided as follows:

32-bit Optimized Pseudocode

```
if ((len = 0) || (RS+1 == 0))
    if (len != 0)
        Index(len) // This could be a length 1 literal
    if (Match0+Match1+Match2+Match3)
        RS = Match0+Match1+Match2+Match3
        len = 4
    else if (Match1+Match2+Match3)
        Literal(0)
        RS = Match1+Match2+Match3
        len = 3
    else if (Match2+Match3)
        RS = Match2+Match3
        len = 2
        if (Match0+Match1)
            Index(2)
        else
            Literal(0)
            Literal(1)
    else if (Match0+Match1+Match2)
        Index(3)
        if (Match3)
            RS = Match3
            len = 1
        else
            Literal(3)
            RS = Match3 // zero vector
            len = 0
    else if (Match0+Match1)
        Index(2)
        Literal(2)
        if (Match3)
            RS = Match3
            len = 1
        else
            RS = Match3 // zero vector
            len = 0
            Literal(3)
    else if (Match1+Match2)
        Literal(0)
        Index(2)
        if (Match3)
            RS = Match3
            len = 1
        else
            RS = Match3 // zero vector
            len = 0
            Literal(3)
    else
        Literal(0)
        Literal(1)
        Literal(2)
        if (Match3)
            RS = Match3
            len = 1
        else
            RS = Match3 // zero vector
            len = 0
            Literal(3)
```

| 32-bit Optimized Pseudocode |
| --- |

```
// Some simple rules for the new optimized design
// With len = 0 or RS+1 is zero, always perform the right side grouping priority
// With len = 1, if there is a new run of 4, or RS+2 (no RS+3 or RS+4) then perform RSG priority
// With len = 2, if there is a new run of 4, perform RSG priority
// With len = 3, Always perform left side grouping priority
// With len = 4, if there is a new run of 4 and RS+1, then perform RSG priority
// With len = 6, if there is RS+3 and any MatchX-Match3 (X=0,1,2), then don't encode index(9)
//                           i.e., only process RS+4 then RS+2
// With len = 7, if there is RS+2 (no RS+3 or RS+4) then don't encode index(9)
// With len = 8, if RS+1 or RS+2 and new run of 4, don't let it encode to index(9) or index(10)
// This will be encoded with all of the special cases first. That will allow for simply commenting
// out some sections to see what the performance differences may be. In addition, the final else
// clause is the old design.
else // Previous cycle let a run of at least length 1
    if (RS+4)   // Test RS+4 before the special cases
        RS = RS+4
        len += 4
    else if ((len == 1) && (Match0+Match1+Match2+Match3)
        Index(1) // This is a literal with the last value
        RS = Match0+Match1+Match2+Match3
        len = 4
    else if ((len == 1) && (RS+2 && ~RS+3 && Match1+Match2+Match3))
        Index(2)
        RS = Match1+Match2+Match3
        len = 3
    else if ((len == 2) && Match0+Match1+Match2+Match3)
        Index(2)
        RS = Match0+Match1+Match2+Match3
        len = 4
    else if (len == 4) && (RS+1 && ~RS+2 && Match0+Match1+Match2+Match3)
        Index(4)
        RS = Match0+Match1+Match2+Match3
        len = 4
    else if (len == 6) && (RS+3 && Match2+Match3) // covers Match23 & Match 123 & Match0123
        Index(8)
        RS = Match2+Match3
        len = 2
    else if (len == 7) && (RS+2 && ~RS+3 && Match1+Match2+Match3) // covers Match 123 and Match0123
        Index(8)
        RS = Match1+Match2+Match3
        len = 3
    else if (len == 8) && (Match0+Match1+Match2+Match3 && ~RS+3)
        Index(8)
        RS = Match0+Match1+Match2+Match3
        len = 4
    else // No special cases do the old stuff
        if (RS+3)
            Index(len+3)
            if (Match3)
                RS = Match3
                len = 1
            else
                Literal(3)
                RS = Match3 // zero vector
                len = 0
        else if (RS+2)
            Index(len+2)
            if (Match2+Match3)
                RS = Match2+Match3
                len = 2
            else if (Match3)
                Literal(2)
                RS = Match3
                len = 1
            else
                Literal(2)
                Literal(3)
                RS = Match3 // zero vector
                len = 0
```

-continued

32-bit Optimized Pseudocode

```
    else if (RS+1)
        Index(len+1)
        if (Match1+Match2+Match3)
            RS = Match1+Match2+Match3
            len = 3
        else if (Match1+Match2)
            Index(2)
            if (Match3)
                RS = Match3
                len = 1
            else
                Literal(3)
                RS = Match3 // zero vector
                len = 0
        else if (Match2+Match3)
            Literal(1)
            RS = Match2+Match3
            len = 2
        else if (Match3)
            Literal(1)
            Literal(2)
            RS = Match3
            len = 1
        else
            Literal(1)
            Literal(2)
            Literal(3)
            RS = Match3 // zero vector
            len = 0
```

What is claimed is:

1. A method comprising:
receiving an uncompressed input string of data bits arranged into fixed-sized chunks;
comparing a multiple number of successive chunks of the input string to previously received chunks of the input string during a single clock cycle;
identifying at least two alternative encoding solutions based on matches obtained during the comparing step, each solution having a different number of indexes and a different number of literals; and
compressing the input string to form a compressed output string using a selected one of the at least two alternative encoding solutions that achieves a fewer number of bits in said output string.

2. The method of claim 1, wherein each of the at least two alternative encoding solutions of the identifying step comprises an index that encodes an associated address value and an associated length value based on a previous occurrence of a chunk in the input string, and wherein each of the at least two alternative encoding solutions encode the same set of data bits in the input string.

3. The method of claim 1, wherein at least one of the two alternative encoding solutions uses at least one literal to express the multiple number of successive chunks in a compressed form, and at least one other of the plurality of alternative encoding solutions does not use a literal to express the selected set of successive chunks in a compressed form.

4. The method of claim 1, wherein the comparing step further comprises comparing each selected one of the multiple successive chunks to each remaining one of the multiple successive chunks.

5. The method of claim 1, further comprising storing the previously received chunks in at least one associative memory and using match logic to concurrently search the previously received chunks in said at least one associative memory for matches with the multiple successive chunks.

6. The method of claim 1, wherein the multiple successive chunks of the comparing step constitute n chunks where n is greater than 1, and wherein the method further comprises concurrently storing duplicate copies of the previously received chunks in n associative memories and carrying out a concurrent search of each of the n chunks in a separate one of the n associated memories.

7. The method of claim 6, wherein the multiple successive chunks of the comparing step constitute n chunks where n is greater than 1, and wherein the method further comprises an n core processor with n processing cores with each processing core concurrently searching for matches of a selected one of the n chunks.

8. The method of claim 1, wherein each chunk constitutes an 8-bit byte of the input string of data bits.

9. The method of claim 1, further comprising decompressing the compressed output string.

10. An apparatus comprising:
a memory which stores previously received chunks of an input string of data bits;
a match module which compares multiple successive chunks of the input string to the previously received chunks during a single clock cycle; and
an encoding module which identifies at least two alternative encoding solutions based on different combinations of matches obtained by the match module for a common set of said chunks, and compresses the input string to form a compressed output string using a selected one of the at least two alternative encoding solutions that achieves a fewer number of bits in said output string.

11. The apparatus of claim 10, wherein the memory is an associative memory with match lines concurrently searchable by the match module, the memory storing a rolling history of the input string, and wherein the apparatus further comprises a write module which appends the multiple successive chunks to the rolling history.

12. The apparatus of claim 10, wherein the encoding module generates a match vector and a run length vector each having an overall depth equal to an overall depth of the memory.

13. The apparatus of claim 10, wherein each of the at least two alternative encoding solutions identified by the encoding module comprises an index that encodes an associated address value and an associated length value based on a previous occurrence of a chunk in the input string.

14. The apparatus of claim 10, wherein the match module further compares each selected one of the multiple successive chunks to each remaining one of the multiple successive chunks.

15. The apparatus of claim 10, wherein the multiple successive chunks constitute n chunks where n is greater than 1, and wherein the memory comprises n associative memories which store duplicate copies of the previously received chunks, and wherein the match module respectively searches each of the n associative memories for a different one of the n chunks.

16. The apparatus of claim 10, characterized as a solid state drive which stores the compressed output string to a page of non-volatile memory.

17. An apparatus comprising a data compression engine adapted to identify a plurality of alternative lossless data encoding solutions available to encode a selected set of successive chunks of uncompressed input data resident in a first memory, and to employ a selected one of said plurality of available encoding solutions to generate a compressed data set in a second memory, each solution having a different total number of indexes, each index having a starting address and a run length.

18. The apparatus of claim 17, in which the data compression engine is further adapted to calculate an overall total number of bits for each of said plurality of alternative encoding solutions, and to identify the selected one of said plurality that provides a fewer total number of bits in the compressed data set.

19. The apparatus of claim 17, in which at least one of the plurality of alternative encoding solutions includes at least one literal to express the selected set of successive chunks in a compressed form, and at least one other of the plurality of alternative encoding solutions provides a sequence that does not include a literal to express the selected set of successive chunks in a compressed form.

20. The apparatus of claim 17, in which the selected one of said plurality of alternate encoding solutions comprises an ongoing match run in the input data.

* * * * *